(12) United States Patent
Blednov

(10) Patent No.: US 7,138,872 B2
(45) Date of Patent: Nov. 21, 2006

(54) POWER AMPLIFIER DEVICE

(75) Inventor: Igor Ivanovich Blednov, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 92 days.

(21) Appl. No.: 10/507,992

(22) PCT Filed: Mar. 20, 2003

(86) PCT No.: PCT/IB03/01051

§ 371 (c)(1),
(2), (4) Date: Sep. 16, 2004

(87) PCT Pub. No.: WO03/081670

PCT Pub. Date: Oct. 2, 2003

(65) Prior Publication Data

US 2005/0104679 A1 May 19, 2005

(30) Foreign Application Priority Data

Mar. 21, 2002 (EP) .................................. 02076105

(51) Int. Cl.
*H01L 23/66* (2006.01)
*H01L 27/102* (2006.01)

(52) U.S. Cl. ...................... 330/302; 330/306; 333/175; 257/306

(58) Field of Classification Search ................ 330/302, 330/305, 306, 307, 30; 257/306; 438/253, 438/387, 396
See application file for complete search history.

(56) References Cited

U.S. PATENT DOCUMENTS 5,880,517 A * 3/1999 Petrosky ..................... 257/577
6,060,951 A    5/2000 Inoue

FOREIGN PATENT DOCUMENTS

EP          0930653    *   7/1999

* cited by examiner

*Primary Examiner*—Stephen E. Jones
(74) *Attorney, Agent, or Firm*—Peter Zawilski

(57) ABSTRACT

The power amplifier device comprises one or more transistors (16) with an output electrode and on top of that a thin-film capacitor. The capacitor comprises a first conductive layer (18), that is also the output terminal of the transistor. It further comprises a first dielectric layer (20) and a second conductive layer (22), that is connected by at least one first connecting wire (30) to said first conductive layer (18). A second connecting wire (34) connects said second conductive layer (22) to an output terminal of the power amplification device (40). In this manner a parallel LC circuit is created, and it is designed such that said parallel LC circuit shows resonance at a harmonic of a frequency (2Fo, 3Fo, 4Fo, 5Fo and so on) amplified by said power amplifier.

9 Claims, 4 Drawing Sheets

POWER AMPLIFIER DEVICE

The invention relates to a power amplifier device having a power amplifier IC device.

From V. J. Tyler, "A new high-efficiency power amplifier", M. Marconi Review 21, pp. 96–109, third quarter 1958, there is known a technique of high-efficiency power, where, at the output of a non-linear active device, a special resonant circuit is attached, which provides a high impedance for the non-desired harmonic of the fundamental signal Fo. In this way, any frequency component can be removed from the output signal. The power of the component is locked in and this provides higher efficiency of the amplifier stage.

In FIG. 1, a basic configuration of such a transistor output circuit is presented comprising of an inductance (L3) 2, a field effect transistor (T1) 4, a parallel resonant circuit which comprises an inductance (L1) 6 and a capacitance (C1) 8, a second parallel resonant circuit comprising an inductance (C2) 10. A capacitance (L2) 12 and a resistance 14, which is equal to the load, are connected together on one side to the resistance which comprises the load. On the other side of the parallel circuit of the inductance 10 and the capacitance 12 is a circuit connection to ground. The other side of the parallel resonant circuit of the inductance 6 and the capacitance 8 is connected to another inductance 2 and to the drain of a field effect transistor 4, which is connected with its source to ground.

The parallel resonant circuit which comprises the inductance 10 and the capacitance 12 is suggested by the above-mentioned paper as an ideal filtering circuit for suppressing all frequency components at an amplifier output below the frequency of the fundamental signal Fo and upper harmonics (including the frequencies of the signals 2Fo, 3Fo, . . . nFo) entirely.

The maximum drain/collector efficiency of this amplifier is predicted by the above-mentioned paper to be about 88.4%, when the 3Fo harmonic reject is used. At 2Fo harmonic reject, theoretical efficiency of the amplifier is 84.9%. And when, for example, both 3Fo+5Fo harmonic reject is used, than predicted efficiency can achieve 92%.

The implementation of this method in amplifiers which are built up by discrete power transistors, has the major disadvantage that, usually, the parallel resonator circuit out of the inductance 6 and the capacitance 8 can not be applied directly to the drain/collector of the power transistor 4.

In fact, in real commonly used circuits the same effect for the band below the fundamental signal Fo is achieved by the implementation of a DC decoupling circuit for the power supply, which is connected to the transistor output outside package and which provides low impedance at low frequency, corresponding to the band of RF signal envelope. A RF output matching circuit or an impedance transformation circuit can be presented as a low pass filter, which consists of micro strip line transformers and ceramic capacitors, where high frequency components can be efficiently suppressed to the level less than −50 dBc. But these 2Fo, 3Fo, and other components generated at the transistor output can not be controlled effectively by the output matching circuits located outside of the transistor package, whatever configuration it is, because package and bond wire parasitic elements are introduced between device collector/drain and matching circuit.

So, there are always some undesired components between the transistor die output and the rest of the amplifier output circuitry, which drastically decrease the effectiveness of this technique especially at the upper end of the RF band.

There are two main problems in traditional power amplifier design where the power transistor is made as a discrete component with flat leads, a ceramic cap and gold wires connecting the die with those leads. Firstly, the resonating circuit has to be located as close as possible to the drain/collector of the transistors die, otherwise, the resonating circuit will not work effectively. Secondly, the resonating circuit is difficult to develop and build up on a dielectric substrate in the traditional power amplifier design with discrete devices at lower end of RF band, and it becomes impossible to build up a high quality and controllable resonating circuit at frequencies above several hundred MHz (for example, in case of 900 MHz power amplifier, this circuit should provide the resonance at 3 Fo=2.7 GHz).

It is an object of the invention to provide a power amplifier device with improved power efficiency having a resonance frequency rejecting feature. To achieve this object a power amplifier is provided having a power amplifier device having an output electrode; a first conductive layer which is connected with the output electrode; a first dielectric layer on top of the first conductive layer; a second conductive layer on top of the first dielectric layer being electrically connected through a first transmission line of desired length to the first conductive layer, whereby a first parallel LC circuit is created comprising the capacitance between the said first (18) and the said second conductive layers an an inductance formed by said first transmission line, said first parallel LC circuit resonating at a harmonic $(2F_0, 3F_0, 4F_0, 5F_0, \ldots)$ of a frequency $(F_0)$ amplified by said power amplifier device, which first LC circuit is connected to an output terminal of the device through a further transmission line.

The invention allows a multi-resonator circuit to be built directly at the power transistor drain/collector, which is highly effective in suppressing the undesired harmonics or frequency components. The new structure of output circuit for a power amplifier allows to improve power efficiency of the device (theoretically more than 85%) by implementation of the harmonic tuning circuit directly at the output electrode of the IC device. This structure can be accomplished simply by adding of isolating layer and then another metal layer step by step on the surface of the output terminal of the IC device.

From U.S. Pat. No. 6,060,951 a power amplifier device is known with a harmonic matching circuit. However, the harmonic circuit is present next to the power amplifier IC device instead of on top of that. The known power amplifier device therewith has the disadvantage that interconnects are necessary between the power amplifier IC device and the harmonic circuit. Besides, the capacitor and inductor of the harmonic circuit have limited values as a consequence of layout constraints, which limits the use of the device to the operation frequency. It does not function properly for devices operating at the low frequency edge of the RF frequency band. Further on, the harmonic circuit has a relatively high parasitic distributed capacitance to the ground through the semiconductor substrate. This destroys the required reject properties of the resonator. Further disadvantages are its low Q-factor, and hence insufficient efficiency. Also, the capacitor is designed as a gap in an interconnect. This has the disadvantage that the capacitor field is not linear and is a disadvantage for design.

Instead, in the power amplifier device of the invention, the parasitic capacitance is reduced. This relates to the parasitic capacitance to the ground due to the fact that the capacitor is present on top of the transistor. It further relates to any parasitic capacitance between an output electrode of the IC device—generally a collector or a drain—and the first conductive layer.

The capacitance provided in the invention are in fact thin-film capacitors. The transmission lines acting as inductances may be provided in thin-film technology. However, it is preferred that these are embodied as connecting wires. Principally one wire is enough, but it is often preferable to use a couple of wires so as to minimize the resistance.

The harmonic circuit can be tuned easily in that the length of the bondwires can be determined effectively. This is based on the insight that the inductance is defined by the length and/or the quantity of the parallel wires, and not by any further elements. Another advantage is that only air surrounds the wires of the inductance L1, so it provides a high Q (quality factor). Furthermore, it is flexible and easy to modify the resonance circuit for another frequency. It is easy to implement an adequate inductance by the above-mentioned technique in the production. This can be done precisely with existing apparatus. It is observed that more than one wire can be present per harmonic circuit.

It is a further advantage of the device of the invention that the material of the dielectric layer can be chosen such as to optimize the capacitor. This can be done, since the dielectric layer does not form part of the IC device and is separated from the IC device through the first conductive layer, therewith preventing any parasitic capacitance. Suitable materials with a high dielectric constant, and with a low dielectric constant are known per se.

In an embodiment a second dielectric layer is present on top of the said second conductive layer at the top of which a third conductive layer is present, which is connected to the second conductive layer with a second transmission line, herewith defining a second parallel LC circuit connected in series between the first LC circuit and the further transmission line and resonating at any other harmonic frequency of the amplified signal than the first LC circuit. The second transmission line is preferably embodied as a connecting wire. This embodiment of the invention allows to implement more than one resonator circuit in series without any parasitic elements in between, which otherwise drastically reduce the efficiency of the technique.

According to a preferred embodiment of the power amplifier device of the invention the arrangement of conductive and dielectric layers and connecting wires is repeated for any resonance frequencies to be eliminated. The possibility to repeat the above-mentioned arrangement contributes further to the increase of the power efficiency.

According to a further embodiment the device is further provided with a resonance circuit for resonating at the fundamental frequency ($F_0$) of the amplifier device, the resonance circuit comprising a series LC circuit with the inductance connected to the first conductive layer and the capacitor connected to ground. For a better performance control and also harmonic phase control the parasitic output capacitance of the device die can advantageously be compensated by a parallel inductance, connected to the ground through MOS capacitor, allowing only RF current through the inductance. With the inductance providing for the resonance at $F_0$, the power amplifier device becomes almost ideal switching element without parasitic capacitance. This will allow to achieve a better control over F-class operation of the power transistor.

In a further embodiment, the output circuitry is modified in such a manner, that it fulfills the conditions for F-class operation more easily. These conditions are fulfilled in that output capacitance compensation is provided both at the frequencies $F_0$ and $3F_0$, and that means are provided for voltage peaking at $3F_0$. Said voltage peaking can for instance be realized in that the voltage wave at the device output is flattened and that the transient time from the "on" state to the "off" state is shortened. The high efficiency power amplifier with the output circuitry of the present embodiment can be embodied both as a discrete component and as a an integrated MMIC version.

The output circuitry of RF power transistors, like LDMOST or bipolar, usually have a very large output parasitic capacitance. This is a most difficult problem to deal with when desiring to design an F-class power amplifier at the frequencies of the RF band. For instance, for a 45 W 1 GHz LDMOST the output capacitance $C_{out}$ is normally around 30–40 pF. As a result, the transistor transient time from the "on" state to the "off" state is not short enough.

The parallel LC circuit connected in series to the RF power transistor according to the invention has the advantage that it can provide an ideal "open circuit" and voltage peaking for the desired harmonic at the transistor output. This already reduces the problem of the transient time. However, the parasitic output capacitance reduces the efficiency benefit of this measure. By implementing a $3F_0$ trap circuit, the efficiency can be further improved. With the $3F_0$ trap circuit it is achieved that the energy of the third harmonic $3F_0$ is used for the flattening of the voltage wave at the transistor output. In this manner, the conditions for the F-class operation can be fulfilled.

According to a preferred embodiment, the power amplifier IC device is a transistor. Alternatively, the power amplifier IC device can be a plurality of transistors, thus effecting that there is a single harmonic circuit for more than one transistor. However, it is preferred that there is a harmonic circuit for each transistor. In the case that the transistor is a MOSFET, the output electrode is the drain-electrode. It is especially preferred that the transistor is of the LDMOS type. Transistors of the LDMOS type have excellent qualities for use in power amplifiers. Due to their lateral configuration they have sufficient size to provide the capacitor on top of the transistor. In the case that the transistor is a bipolar transistor, the output electrode is the collector electrode.

The transistor is preferably defined in a silicon substrate. However, the invention is not limited thereto, but can be used as well for transistor in any other semiconductor substrate. In the case of a silicon substrate, the transistor may have a layer of polysilicium, which acts as the first conductive layer, and in which layer also the gate-electrode of the MOSFET is defined. Therewith, the gate electrode and the capacitor electrode are mutually isolated.

These and various other advantages and features of novelty which characterize the present invention are pointed out with particularity in the claims annexed hereto and forming a part hereof. However, for a better understanding of the invention, its advantages, and the object obtained by its use, reference should be made to the drawings which form a further part hereof, and to the accompanying descriptive matter in which there are illustrated and described preferred embodiments of the present invention.

Preferred embodiments of the invention are now described with reference to the drawings in which;

FIG. 2 shows an example of the power amplifier device with two parallel resonators or resonating circuits which are connected in series on the top of drain or collector metallization area of a power amplifier IC device 16 and form a compensation circuit for output capacitance.

Figure 1:
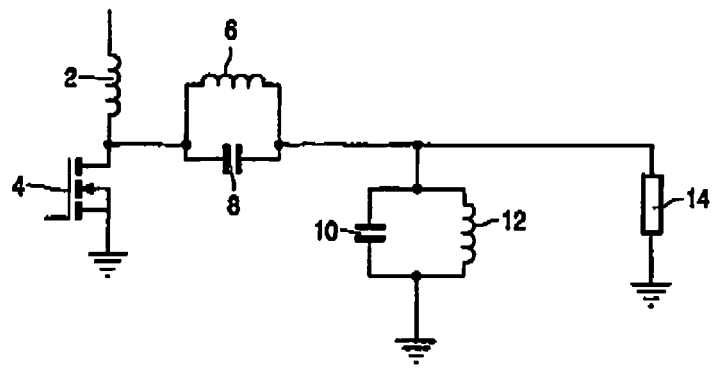
FIG. 1 is a basic configuration of high efficiency power amplifier output circuit, which is well known.

In the embodiment shown, the power amplifier comprises the die of a power amplifier IC device 16, a metal layer 18, which is the drain or collector contact, an isolator layer 20, another metal layer 22 forming a capacitor with the metal layer 18, another isolator layer 24, and a further metal layer 26 forming a capacitor with the metal layer 22. Two bond wires, (which also can be consisting of parallel coupled bond wires) 28 and 30 form the inductances of resonator circuits, and the bond wire 32 (which also can be consisting of parallel coupled bond wires) is a compensating inductance for parasitic output capacitance (Cout) 36 and is connected to a transistor output lead 40. An output bond wire 34 (which also can be consisting of parallel coupled bond wires). The bond wire 32 is connected to a MOS capacitor 38 which is grounded.

The layers 18, 20 and 22 form a capacitor. Parallel to the capacitor of the layers 18, 20 and 22 is the inductance formed by a bond wire 30 (which also can be consisting of parallel coupled bond wires). This parallel circuit comprising a capacitor and an inductance forms the first parallel resonator. The three layers 22, 24, and 26 form a second capacitor. Parallel to this capacitor is the inductance of the bond wire 28. This arrangement forms a second parallel resonator, which comprises an inductance and a capacitance. The second parallel resonator is connected in series to the first parallel resonator.

The bond wire 34 is connected to the top surface of layer 26, which is connected, on its bottom surface, to the output terminal 40 of the power amplification device 16. The parasitic output capacitance 36 is disposed between the layer 18 and the heat sink of the power amplifier IC device. In order to compensate the parasitic output capacitance 36 it is necessary to use a circuit which comprises the bond wire 32 which forms an inductance connected in series to the MOS capacitor 38 and providing a parallel resonance with capacitance 36.

Just one resonator, when tuned for 2Fo or 3Fo, will provide a mode with second or third harmonic peaking, correspondingly, which leads to the predicted power efficiency of 84.9% or 88.4%. When both resonators are used connected in series at the top of transistor die collector or drain area, than device efficiency can be improved even more, and at both 3Fo and 5Fo harmonic peaking can rich 92%.

For better performance control and also harmonic phase control, the parasitic output capacitance 36 of the power amplifier IC device 16 can be compensated by the parallel inductance of bond wire 32 which is connected to the ground through MOS capacitor 38 allowing only RF current through the inductance of bond wire 32.

With the inductance of the bond wire 32 tuned for resonance at Fo, the power transistor becomes almost ideal switching element without parasitic capacitance. This will allow to achieve a better control of a F-class operation of the power transistor. The inductance of bond wire 32 and the capacitance 38 having a resonance at 3Fo, now become part of the power transistor and do not form an "output network". Thus, it is guaranteed that the compensation circuit is located as close as possible to the power amplifier IC device 16 without any significant parasitic elements between transistor drain/collector and the compensation circuit.

Figure 2:
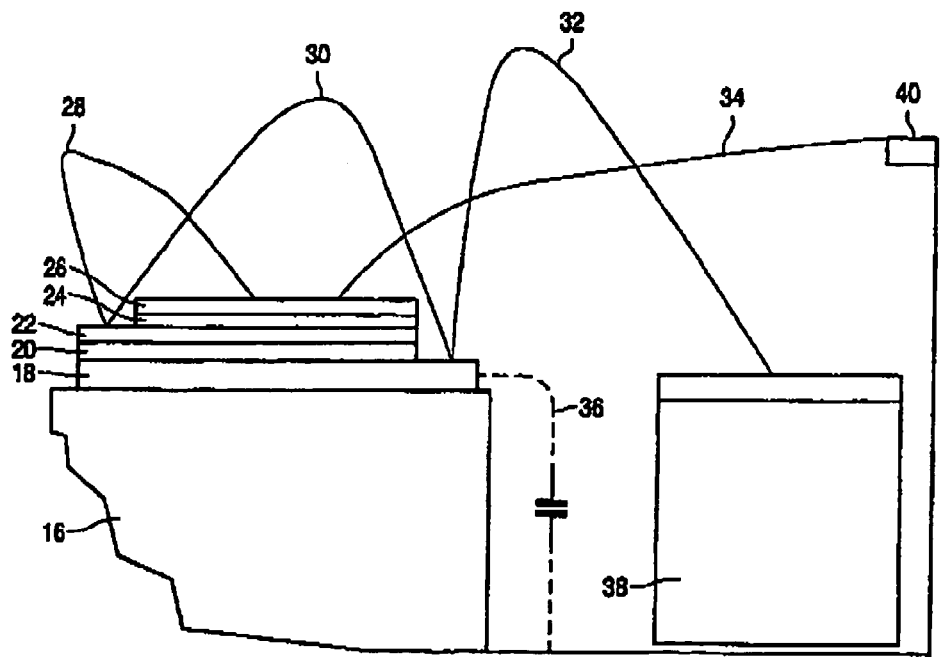
FIG. 2 is an example of the power amplifier device with two parallel resonators connected in series on the top of a transistor drain or a collector metalization area and compensation circuit for output capacitance.

A resonating circuit at 3Fo comprises the capacitance which is formed by the layers 18, 20, and 22, and the inductance which is formed by the bond wire 28. Thus the resonating circuit is implemented directly on the surface of the power transistor die. The capacitance is embodied as a series capacitor at the drain contact layer (as it is shown in FIG. 2) which, in this case, serves as lower plate of the capacitance formed by the layers 18, 20, and 22. Then the inductance (about 0.3 nH) formed by the bond wire 28, preferably out of gold, connecting the drain contact of the transistor 16 with upper plate 26, which then is connected by another bond wire/wires to the package lead 40 or output terminal 40.

In use, the values of the capacitance formed by the layers 18, 20, and 22 and the inductance formed by the bond wire 28 are relatively small, for example 10 pF and 0.3 nH respectively. Therefore, the implementation of the capacitance and the inductance at the die surface of the power amplifier is not a difficult task. Also the desired resonance frequency can easily be adjusted to any other frequency by changing the lengths, quantity and inductive coupling of the parallel bond wires.

This is a very advantageous approach, because (1) only air surrounds the wires of L1, resulting in a high Q; (2) there are no significant parasitic elements between the power amplifier die lead at the drain/collector and resonant circuit; (3) the resonating circuit is flexible or easy to modify for another frequency; and (5) the resonating circuit is easy to implement in production.

Figure 3:
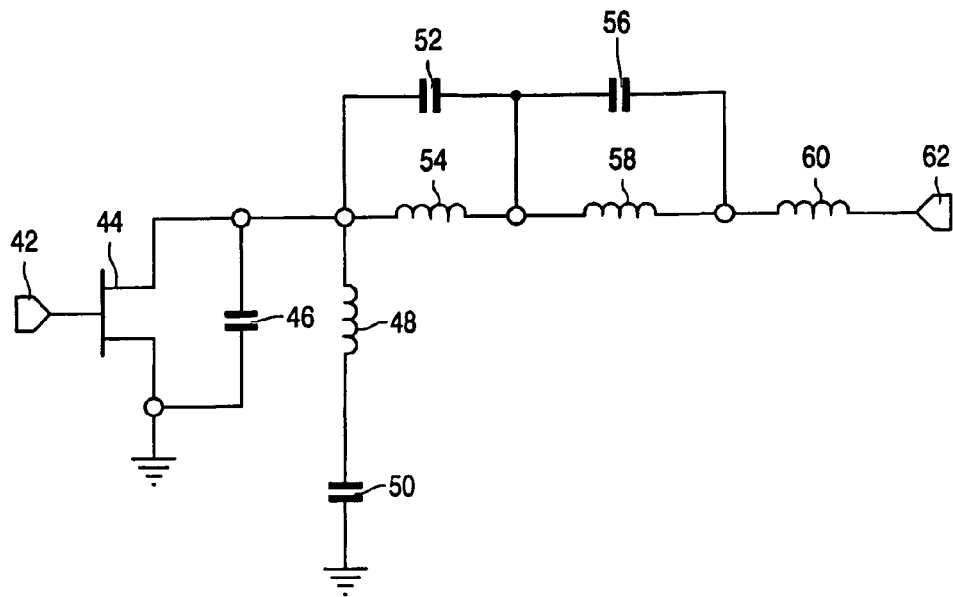
FIG. 3 is an equivalent schematic of the example, which is shown in FIG. 2.

FIG. 3 shows an equivalent circuit of the structure of FIG. 2. The equivalent circuit comprises a signal source 42 connected to the gate of the field effect transistor 44. The source of the field effect transistor 44 is connected to ground and to one side of the capacitor 46. The drain of the field effect transistor 44 is connected with the other side of the capacitance 46 and with one side of the capacitance 52, inductance 54, and the inductance 48. The inductance 48 is connected with one side to the capacitance 50. The other side of the capacitance 50 is connected with ground. The other side of the capacitance 52 is connected with one side of the capacitance 56, and the inductance 54 and with one side of the inductance 58. The other side of the capacitance 56 is connected to the other side of inductance 58 and the inductance 60. The other side of the inductance 60 is connected with the output 62.

The capacitance 46 is the capacitance equivalent of the output capacitance 36 of FIG. 2. To compensate the output capacitance 46, the series circuit of the inductance 48 and the capacitance 50 is used. The inductance 48 is equivalent to the bond wire 32 and the capacitance 50 is equivalent to the MOS capacitance 38. The circuit comprising the inductance 48 and the capacitance 50 is a part of the power transistor and not a part of the "output network". This circuit has a parallel resonance at frequency equal to Fo or close to it.

The first parallel resonator comprising the inductance 54 and the capacitance 52 is tuned for 2fo or 3fo and will provide a mode with second or third harmonic peaking, correspondingly, which leads to the predicted power efficiency of 84.9% or 88.4%. The second parallel resonator, which is in series to the first resonator, comprises the capacitance 56 and the inductance 58. The second parallel resonator can be built for better voltage wave form and higher efficiency which is tuned for the fifth harmonic. Between the second parallel resonator and the output 62 is the inductance 60 which is formed by the bond wire 34. The output 62 is equivalent to the output terminal of the power amplification device 40.

Figure 4:
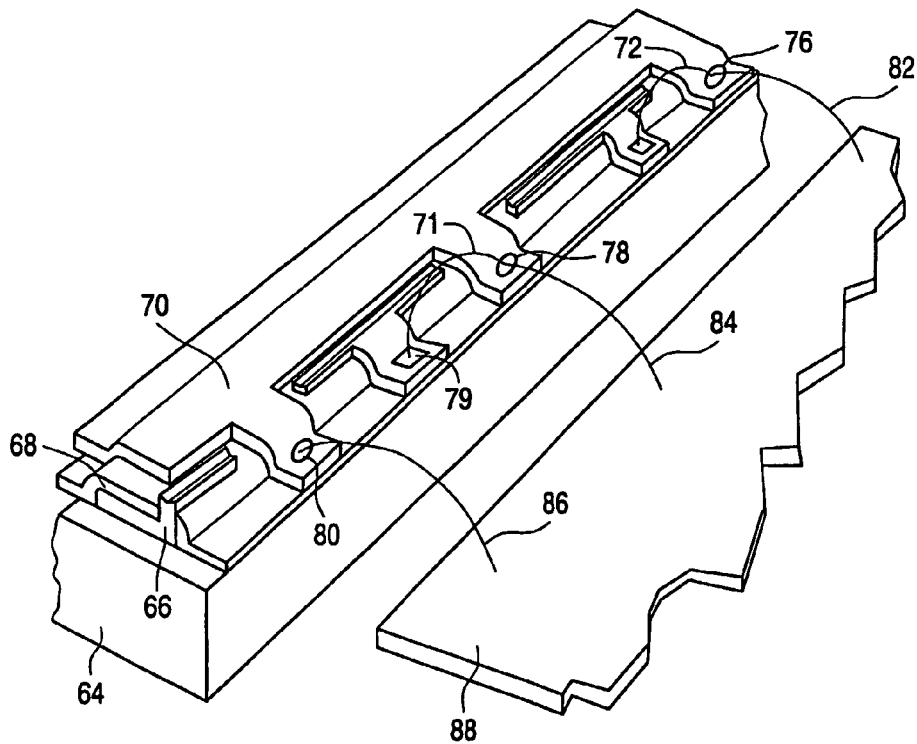
FIG. 4 is a possible arrangement for LDMOS transistors.

FIG. 4 shows a possible arrangement for a LDMOS transistor in an embodiment of the invention. The arrangement comprises a die 64, a lower plate 66 which is for example made by poly Si, an insulator layer 68 and an upper plate 70 forming a capacitance of a first parallel resonator. A bond wire 71 is connected between a contact 79 of the lower plate 66 and a contact 78 of the upper plate 70. A bond wire 72 is connected between a contact 77 of the lower plate 66 and a contact 76 of the upper plate 70. The bond wires 71 and 72 form an inductance of the first parallel resonator. A bond wire 82 is connected between the contact 76 and a package lead 88. A bondwire 84 is connected between the contact 78 and the package lead 88. A bondwire 86 is connected between a contact 80 and the package lead 88. The bond wires 82, 84, and 86 connect the first parallel resonator with the package lead 88 or a output terminal 88.

Figure 5:
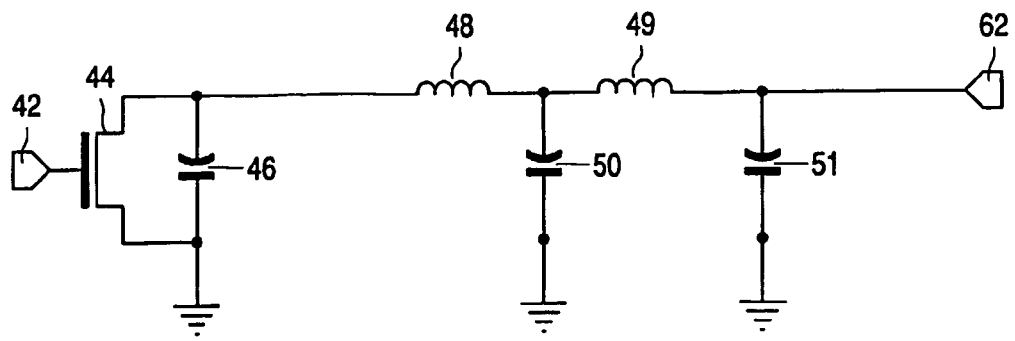
FIG. 5 is an equivalent schematic of a reference circuit.
Figure 6:
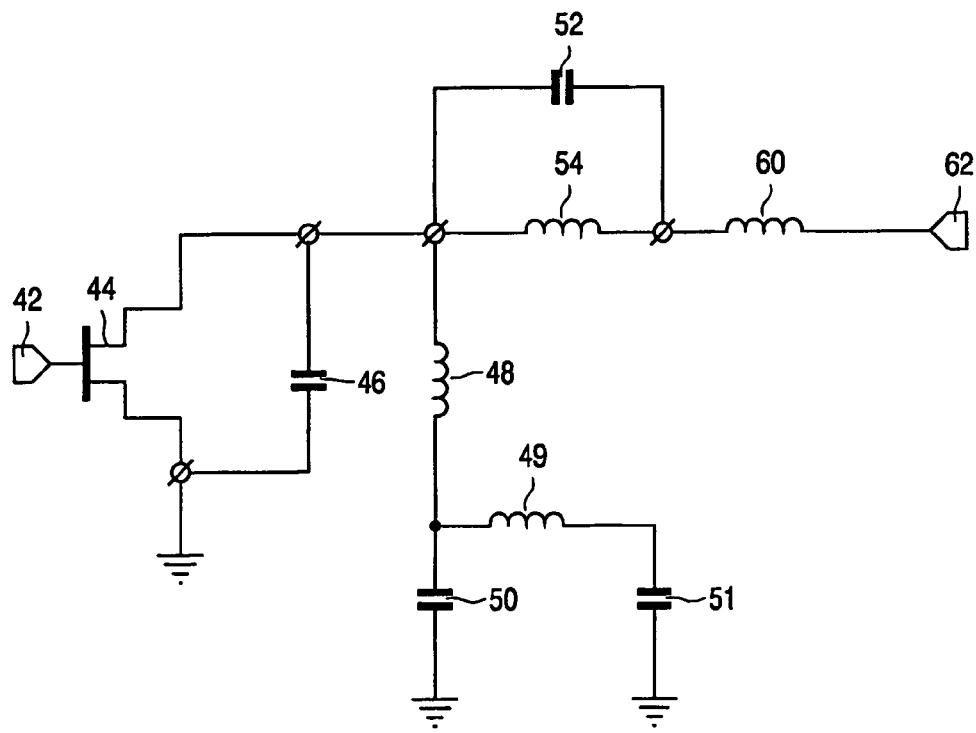
FIG. 6 is an equivalent schematic of a preferred embodiment of the invention.
Figure 7:
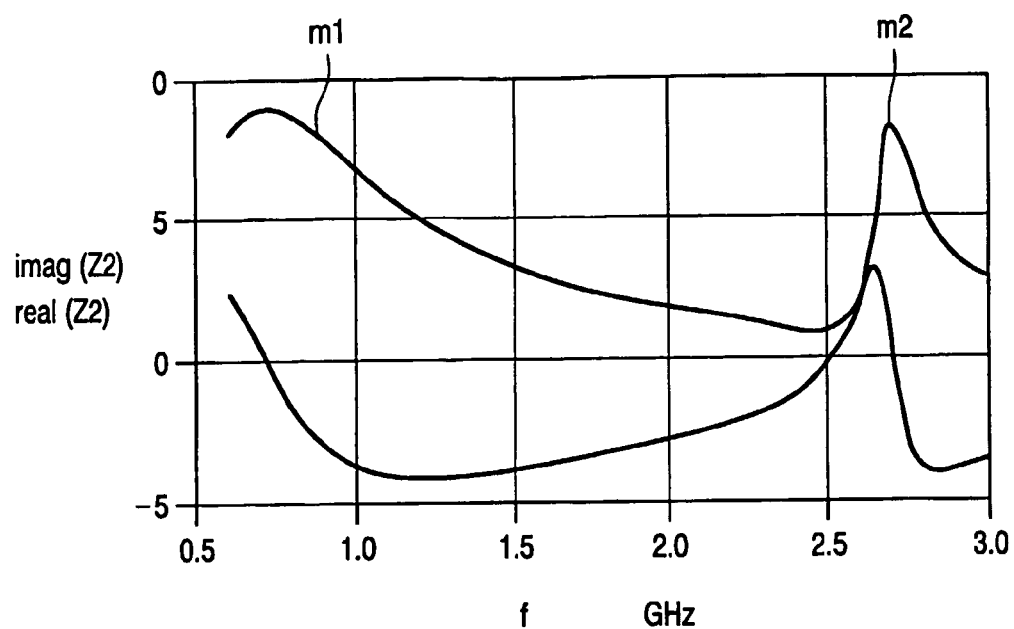
FIG. 7 is a graph showing the impedance as a function of the frequency for the reference circuit of FIG. 5.
Figure 8:
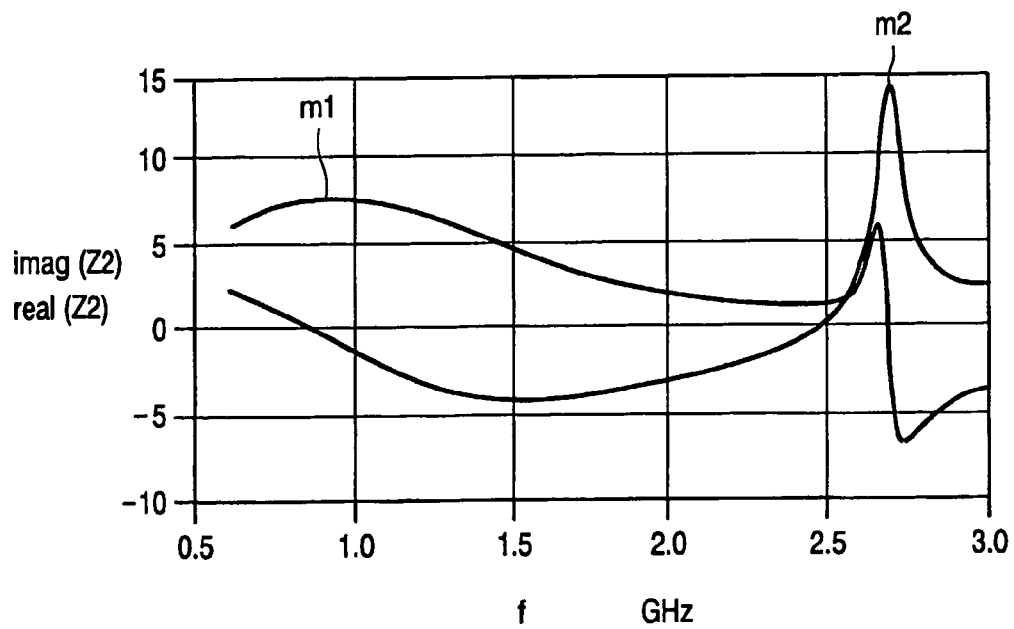
FIG. 8 is a graph showing the impedance as a function of the frequency for the preferred embodiment of the invention.

In a preferred embodiment of the invention, a $3F_0$ trap is used in the output circuitry. The effect will be explained with reference to the FIGS. 5 to 8. FIG. 5 is an equivalent schematic of a reference circuit without the harmonic trap. FIG. 6 is the equivalent schematic of the preferred embodiment with the harmonic trap and with the $3F_0$ trap. FIGS. 7 and 8 are graphs showing the impedance as a function of the frequency for the circuits as shown in FIGS. 5 and 6 respectively. For the sake of clarity, the same reference symbols have been used in FIGS. 3, 5 and 6, as far as representing the same elements.

The circuit of FIG. 5 includes an inductance 48 and the capacitance 50 which are used to compensate the output capacitance 46. In this example, the output capacitance 46, is 40 pF, the inductance 48 is 0.4 nH and the capacitance 50 is 16 pF. In addition thereto, in order to provide a compensation of the output capacitance at the third harmonic frequency $3F_0$, it comprises a further LC-network connected to ground comprising the inductance 49 of 0.7 nH and the capacitance 51 of 1000 pF.

The resulting behaviour of this reference circuit is shown in FIG. 7. Herein the real part of the impedance is shown by the upper line and the imaginary part is shown by the lower line. As is clear, the real part of the impedance hast two clear maxima m1, m2, one near the fundamental frequency $F_0$ and one at the frequency of the third harmonic $3F_0$.

The circuit of FIG. 6 corresponds to that of FIG. 4 with the addition of the further LC network comprising the inductance 49 of 0.7 nH and the capacitance 51 of 1000 pF. The corresponding graph of FIG. 8 shows that in the real part of the impedance has again two maxima m1,m2. The first maximum m1 is now not near but at the fundamental frequency $F_0$. The second maximum is again at the frequency of the third harmonic $3F_0$. In comparison to the behaviour of the reference circuit both the imaginary and the real part of the impedance at the frequency $3F_0$ is much higher, i.e. there is a larger resonance. The use of the third harmonics trap circuit comprising the capacitor 52 and the inductor 54 leads to a notch or an open circuit at the third harmonic frequency $3F_0$. This flattens the voltage wave at the drain of the transistor, and create the conditions for the F-class operation mode.

In short, the power amplifier device comprises one or more transistors with an output electrode and on top of that a thin-film capacitor. The capacitor comprises a first conductive layer, that is also the output terminal of the transistor. It further comprises a first dielectric layer and a second conductive layer, that is connected by at least one first connecting wire to said first conductive layer. A second connecting wire connects said second conductive layer to an output terminal of the power amplification device. In this manner a parallel LC circuit is created, and it is designed such that said parallel LC circuit shows resonance at a harmonic of a frequency amplified by said power amplifier.

New characteristics and advantages of the invention covered by this document have been set forth in the foregoing description. It will be understood, however, that this disclosure is, in many respects, only illustrative. Changes may be made in details, particularly in matters of shape, size, and arrangement of parts, without exceeding the scope of the invention. The scope of the invention is, of course, defined in the language in which the appended claims are expressed.

The invention claimed is:

1. A power amplifier having
   a power amplifier device (16) having an output electrode;
   a first conductive layer (18) which is connected with the output electrode;
   a first dielectric layer (20) on top of the first conductive layer (18);
   a second conductive layer (22) on top of the first dielectric layer (20) being electrically connected through a first transmission line (30) of desired length to the first conductive layer (18),
      whereby a first parallel LC circuit is created comprising the capacitance between the said first (18) and the said second (22) conductive layers an an inductance formed by said first transmission line (30), said first parallel LC circuit resonating at a harmonic ($2F_0$, $3F_0$, $4F_0$, $5F_0$, ...) of a frequency ($F_0$) amplified by said power amplifier device (16),
   which first LC circuit is connected to an output terminal (40) of the device through a further transmission line (34), thereby providing a harmonic frequency suppression circuit integral with said power amplifier; and wherein a second dielectric layer (24) is present on top of the said second conductive layer (22) at the top of which a third conductive layer (26) is present, which is connected to the second conductive layer (22) with a second transmission line (28), herewith defining a second parallel LC circuit connected in series between the first LC circuit and the further transmission line (40) and resonating at any other harmonic frequency of the amplified signal than the first LC circuit.

2. The power amplifier as claimed in claim 1, further provided with a resonance circuit for resonating at the fundamental frequency ($F_0$) of the amplifier device (16), the resonance circuit comprising a series LC circuit with the inductance (32) connected to the first conductive layer (18) and the capacitor (38) connected to ground.

3. The power amplifier as claimed in claim 1, wherein the first and second transmission lines (30,28) are embodied as one or more connecting wires.

4. The power amplifier as claimed in claim 1, wherein the further transmission line is embodied as a connecting wire.

5. The power amplifier as claimed in claim 1 wherein the resonance circuit arrangement is repeated for any of the resonance frequencies to be eliminated.

6. The power amplifier as claimed in claim 5, further comprising a compensation circuit (49,51) being connected to the resonance circuit for resonating at the fundamental frequency ($F_o$).

7. The power amplifier as claimed in claim 6, wherein the compensation circuit is a series LC network connected to ground.

8. The power amplifier as claimed in claim 1, wherein the power amplifier device (16) comprises at least one transistor of the LDMOS type.

9. The power amplifier as claimed in claim 8, wherein the first conductive layer (18) comprises polysilicon, a gate electrode of the transistor is on the polysilicon, the gate electrode and the area of the first conductive layer acting as a capacitor electrode being mutually isolated.

* * * * *